United States Patent
Sakamoto et al.

[11] Patent Number: 6,158,645
[45] Date of Patent: Dec. 12, 2000

[54] METHOD OF BONDING RADIATION PLATE

[75] Inventors: Yasushi Sakamoto; Kenji Kurafuji, both of Yukuhashi, Japan

[73] Assignee: Rohm Co., Ltd., Kyoto, Japan

[21] Appl. No.: 09/056,532

[22] Filed: Apr. 8, 1998

[30] Foreign Application Priority Data

Apr. 11, 1997 [JP] Japan ..................... 9-093981

[51] Int. Cl.[7] .................. B23K 1/06; B23K 5/20
[52] U.S. Cl. .................. 228/110.1; 228/44.7; 228/1.1
[58] Field of Search .................. 228/1.1, 44.7, 228/110.1

[56] References Cited

U.S. PATENT DOCUMENTS

| | | | |
|---|---|---|---|
| 3,670,394 | 6/1972 | Daniels et al. | 29/470.1 |
| 3,750,926 | 8/1973 | Sakamoto et al. | 228/1 |
| 3,995,845 | 12/1976 | Scheffer | 269/254 |
| 4,545,119 | 10/1985 | Tanazawa | 29/839 |
| 4,618,516 | 10/1986 | Sager | 428/35 |
| 4,825,533 | 5/1989 | Hayashi et al. | 29/605 |
| 5,603,444 | 2/1997 | Sato | 228/1.1 |
| 5,651,494 | 7/1997 | Ogino et al. | 228/110.1 |
| 5,686,361 | 11/1997 | Ootsuki | 437/216 |
| 5,825,082 | 10/1998 | Takahashi | 257/685 |

*Primary Examiner*—Patrick Ryan
*Assistant Examiner*—Lynne Edmondson
*Attorney, Agent, or Firm*—Jordan and Hamburg LLP

[57] ABSTRACT

In a semiconductor device having a radiation plate and a method of boding the radiation plate, a radiation plate is overlaid on a die pad formed at the center portion of a lead frame, the die pad and the radiation plate are clamped from upper and lower sides by clamp members, and then ultrasonic wave are is applied to the interface between the die pad and the radiation plate to bond the radiation plate to the die pad with ultrasonic wave, the depth of scratches formed on the surface of the die pad which are formed by the clamp member are reduced to 15 $\mu$m or less at maximum and/or 2.0 $\mu$m on the average.

16 Claims, 8 Drawing Sheets

METHOD OF BONDING RADIATION PLATE

BACKGROUND OF THE INVENTION

The present invention relates to a semiconductor device having a radiation plate and a method of bonding a radiation plate.

A semiconductor device with a metal radiation plate bonded to a die pad to which a semiconductor element (IC chip) is die-bonded has been hitherto known as one type of semiconductor device having a semiconductor element (IC chip) having a relatively large heating value, such as a motor driver IC, a voice amplifying IC or the like. The die-bonding of the metal radiation plate to the die pad may be performed with adhesive agent, however, an ultrasonic bonding method is preferable because the adhesive agent has higher resistance to heat and thus it produces a thermal restriction in a fabrication process of semiconductor devices.

Here, the ultrasonic bonding of a die pad and a radiation plate with ultrasonic wave will be described with reference to FIG. 14.

First, a die pad 100 which is formed integrally with a lead frame (not shown) is put face down and mounted on a metal holding member 200 serving as a clamp member, and then a radiation plate 300 is superposed on the back surface of the die pad 100 as shown in FIG. 14. Thereafter, an ultrasonic horn 400 is disposed by a metal press member 500 serving as a clamp member on the radiation plate 300.

Subsequently, the radiation plate 300 is pressed from the upper side by the press member 500, and ultrasonic waves are applied through the press member 500 so that the ultrasonic wave acts on an interface between the die pad 100 and the radiation plate 300 to bond the die pad 100 and the radiation plate 300.

Each of the holding member 200 and the press member 500 is provided with a knurled face 600 to prevent the die pad 100 and the radiation plate 300 from slipping along each other, whereby the die pad 100a and the radiation plate 300 can be surely held.

After the above bonding process, a semiconductor element (IC chip) is die-bonded onto the die pad 100, and then the semiconductor element is wire-bonded to lead terminals of the lead frame. Thereafter, the result is molded in epoxy resin, and an undesired frame portion is removed to complete a semiconductor device.

In the above-described ultrasonic bonding method of the radiation plate 300, the knurled face 600 is provided on the upper surface of the holding member 200 for holding the die pad 100, and thus a plating layer formed on the surface of the die pad 100 is liable to be deeply scratched.

The deep scratches in the plating layer on the surface of the die pad 100 disturbs expansion (diffusion) of solder when the semiconductor element is die-bonded to the die pad 100, so that the semiconductor element cannot be surely bonded to the die pad.

In order to avoid the above problem, a method of omitting the knurled face 600 and holding the frame of the lead frame with pins or clamping the lead frame from upper and lower sides has been utilized. However, the vibration of the ultrasonic wave is transmitted to the pins or the clamping position, resulting in damage to the leads, or induces a slipping motion between the die pad 100 and the hold member 200 making the bonding unstable, or making the bonding strength lower even when the bonding succeeds.

SUMMARY OF THE INVENTION

An object of the present invention is to provide a semiconductor device having a radiation plate and a radiation plate bonding method which avoid the above problem.

In order to attain the above object, according to a first aspect of the present invention, a semiconductor device which is formed by overlaying a radiation plate on a die pad formed at a center portion of a lead frame, clamping the die pad and the radiation plate by a clamp member and applying ultrasonic waves thereto to bond the radiation plate to the die pad with ultrasonic waves The depth of scratches on the surface of the die pad which are formed by the clamp member is set to 15 $\mu$m or less at maximum and/or 2.0 $\mu$m on the average. Accordingly, a semiconductor device having high radiation performance can be obtained. In addition, in the manufacturing process, the scratches on the surface are not formed so deeply that the plating layer on the surface of the die pad is not peeled off, and the expansion (diffusion) of the solder is prevented from being disturbed in the die-bonding process, so that the semiconductor element is bonded to the die pad.

According to a second aspect of the present invention, a method of bonding a radiation plate includes the steps of overlaying a radiation plate on a die pad formed at a center portion of a lead frame, clamping the die pad and the radiation plate by upper and lower clamps each of which has a knurled face consisting of many grooves in same direction formed on the clamp face thereof, the knurled surface of the clamp member for holding the surface of the die pad being grooved in a direction perpendicular to an ultrasonic wave direction, and applying ultrasonic waves through the clamp members to bond the die pad and the radiation plate with ultrasonic waves. Accordingly, slippage of the die pad is surely prevented, and the radiation plate is firmly bonded to the die pad. In addition, scratches formed on the surface of the die pad are not formed so deeply that the plating layer is peeled off.

In the radiation plate bonding method of the second aspect of the present invention, the depth of knurl grooves is set to 20 to 30 $\mu$m. Accordingly, the radiation plate is bonded to the die pad while it is surely prevented that such deep scratches are formed as promote the plating layer to be peeled off the surface of the die pad.

Further, in the radiation plate bonding method of the second aspect of the present invention, the ultrasonic wave are applied from the clamp member side for holding the surface of the radiation plate.

Still further, in the radiation plate bonding method of the second aspect of the present invention, the ultrasonic waves are applied from the clamp member side for holding the surface of the die pad.

According to the present invention, in the semiconductor device which is constructed by overlaying the radiation plate on the die pad formed at the center portion of the lead frame, and applying ultrasonic waves while the die pad and the radiation plate are clamped from the upper and lower sides by the clamp member to bond the radiation plate and the die pad using ultrasonic waves, the depth of the scratches on the surface of the die pad formed by the clamp member is set to 15 $\mu$m or less at maximum, and/or 2.0 $\mu$m or less on the average.

The ultrasonic bonding method of the radiation plate to achieve the above surface roughness will be described.

That is, the radiation plate is overlaid on the die pad formed at the center portion of the lead frame, the die pad and the radiation plate are clamped from the upper and lower sides having the knurled face on the clamp faces thereof, the knurled face formed of the clamp member for holding the surface of the die pad being grooved in the direction perpendicular to the ultrasonic wave applying direction, and then the die pad and the radiation plate are bonded to each other by applying the ultrasonic waves through the clamp member.

At this time, the depth of the grooves of the knurled face of the clamp member which holds the surface of the die pad are preferably set to 20 to 30 μm. With this design, the scratches formed on the surface of the die pad is reduced to 15 μm or less at maximum, or 2.0 μm or less on the average, and there is no risk that the plating layer is peeled off. In addition, the solder for die bonding can be sufficiently expanded (diffused) because the scratches are shallow. Therefore, the semiconductor element is surely bonded to the die pad. In addition, the bonding of the radiation plate is firmly performed.

The ultrasonic bonding method of the radiation plate according to the present invention will be described more specifically hereunder.

First, the holding face of the clamp member, which is disposed below the surface of the die pad and holds the surface of the die pad, is grooved only in the direction perpendicular to the ultrasonic wave applying direction. Thereafter, a lead frame having the die pad at the center portion thereof is mounted on the clamp member while placed face down, the radiation plate is positioned to be overlaid on a back surface of the die pad, and then an ultrasonic horn which is mounted on the upper clamp member, is moved downwardly together with the upper clamp member to press the radiation plate.

Subsequently, ultrasonic wave are applied from the ultrasonic horn through the upper clamp member to act the ultrasonic wave to the interface between the die pad held by the lower clamp member and the radiation plate pressed by the upper clamp member, whereby the radiation plate is bonded to the die pad.

Since the knurled face of the lower clamp member, which holds the surface of the die pad is grooved only in the direction perpendicular to the ultrasonic wave applying direction, no vibration occurs in the longitudinal direction of the many grooves which constitute the knurled face. Therefore, not deep scratch which causes the plating layer to be peeled off is formed on the surface of the die pad by the edges. At the same time, the grooves formed only in the direction perpendicular to the ultrasonic waves act in the vibration direction to efficiently prevent slippage of the die pad. Accordingly, the ultrasonic wave concentratively acts on the interface between the die pad and the radiation plate to surely bond the radiation plate and the die pad together.

In the above method, the die pad is disposed at the lower side while the radiation plate is disposed at the upper side. However, conversely, it may be adopted that the radiation plate is mounted on the lower clamp member, the die pad is positioned and mounted on the radiation plate so that the back surface of the die pad is overlaid on the radiation plate, the die pad is pressed by the upper clamp member and then ultrasonic wave are applied.

In this case, it follows that the face of the upper clamp member for pressing the surface of the die pad is grooved only in the direction perpendicular to the ultrasonic wave applying direction as described above. That is, the application of the ultrasonic waves may be performed from any one of the clamp member side for holding the surface of the radiation plate and the clamp member side for holding the surface of the die pad.

Further, when the die pad and the radiation plate are clamped by the upper and lower clamp members, there may be used any one of a method of keeping the lower clamp member stationary and moving the ultrasonic horn downwardly together with the upper clamp member, and a method of moving the ultrasonic hone (and the upper clamp member) and the lower clamp member so as to approach each other.

Further, the ultrasonic horn is not necessarily required to be linked to the upper clamp member, and it may be disposed at the lower side and linked to the lower clamp member.

DETAILED DESCRIPTION OF THE PREFERRED EMBODIMENTS

Preferred embodiments according to the present invention will be described hereunder with reference to the accompanying drawings.

Figure 1:
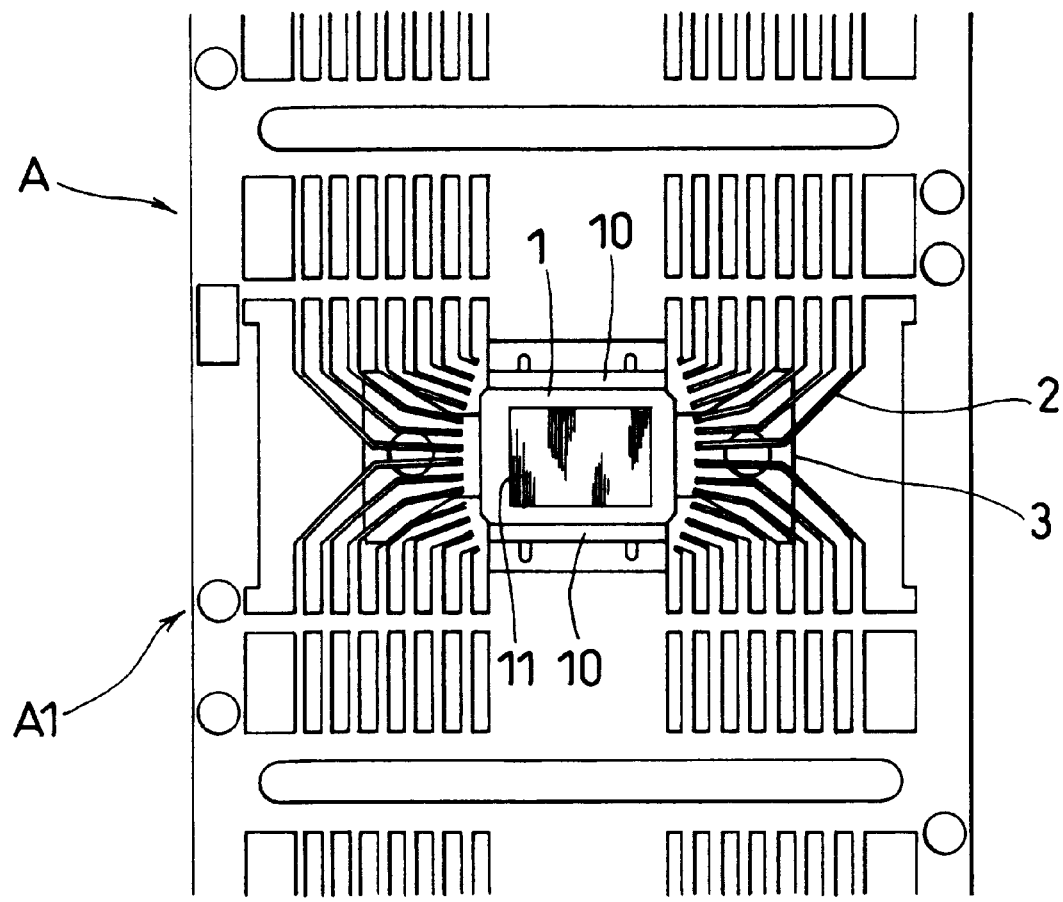
FIG. 1 is a plan view showing a lead frame in a semiconductor device according to the present invention.
Figure 2:
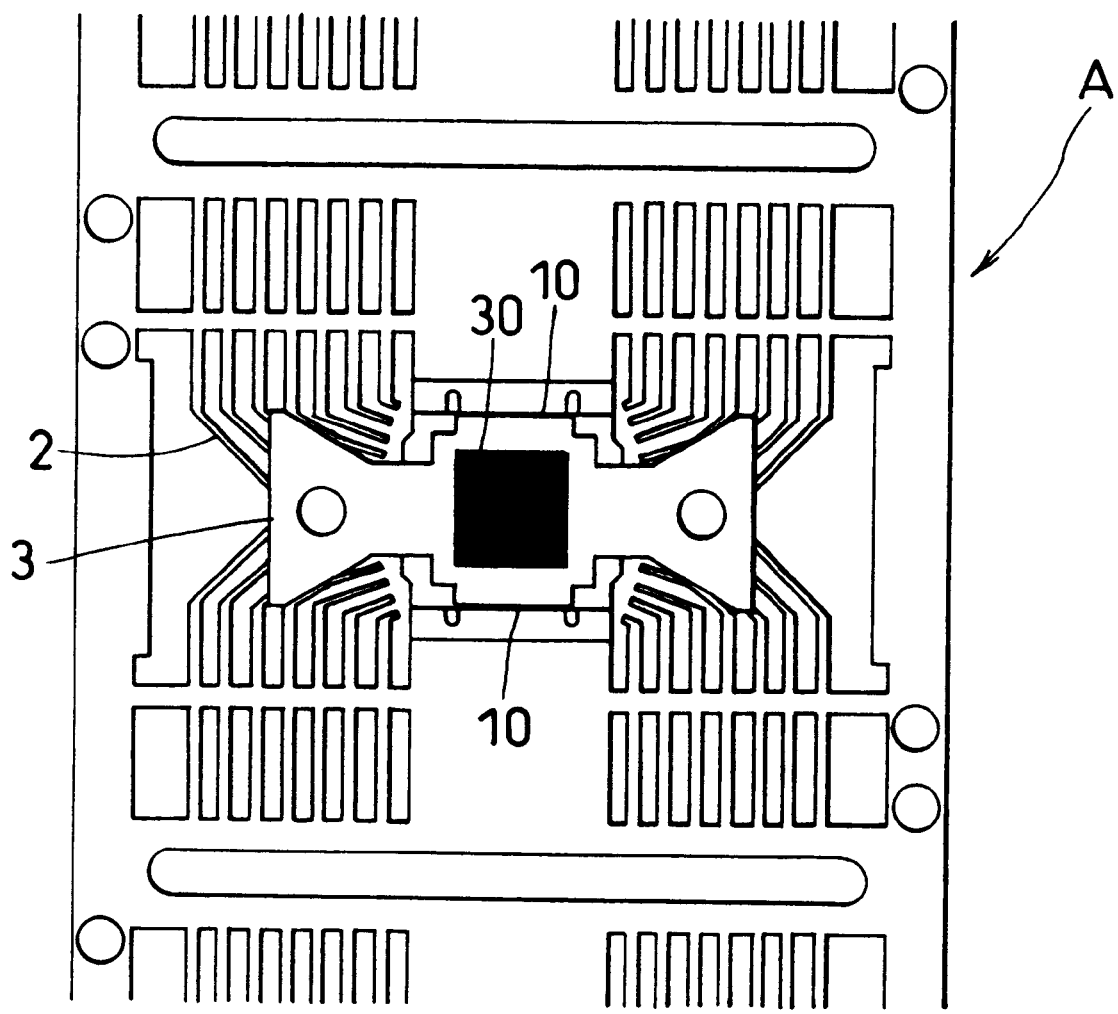
FIG. 2 is a bottom view of the lead frame of FIG. 1.
Figure 3:
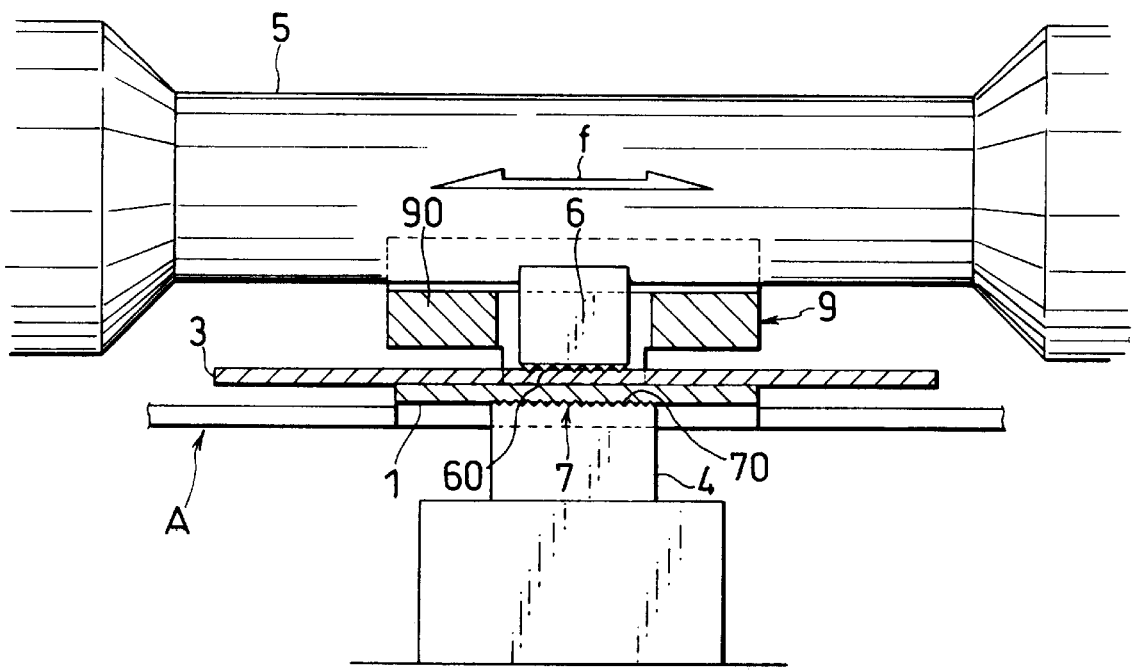
FIG. 3 is a first diagram showing an ultrasonic bonding method of a radiation plate according to the present invention.

FIG. 1 is a plan view showing a lead frame in a semiconductor device having a radiation plate according to an embodiment of the present invention and FIG. 2 is a bottom view of the lead frame.

In FIGS. 1 and 2, A represents a lead frame, and the lead frame has unit areas A1 which are continuously in the longitudinal direction, each unit area A1 having a die pad 1 and plural leads 2 which will be separated from the lead frame A in subsequent processes.

The die pad 1 and the leads 2 are formed of copper alloy, iron/nickel alloy or the like. The die pad 1 is disposed at a center of the unit area A1, and the leads 2 are formed so as to extend from an outer edge of the unit area A1 to the peripheral portion of the die pad 1.

The die pad 1 is downwardly bent at the peripheral edge portions 10 thereof so that it is located at a lower position than the leads 2, and also the surface of the die pad 1 is coated with a metal plating layer which is conformable to solder because a semiconductor element (not shown) will be subsequently fixed to the die pad 1 by the solder.

The radiation plate 3 serves to efficiently radiate the heat generated in the semiconductor device, and it is bonded to a back surface of the die pad using ultrasonic waves. A small gap is formed between the radiation plate 3 and each lead 2 to prevent short-circuiting therebetween.

A semiconductor element is fixed to the die pad 1 in each unit area A1 by solder, and the semiconductor element is connected to the leads 2 by narrow metal wires (Wire Bonding). Thereafter, it is molded with resin or the like, extra outer edges, etc. of the lead frame A are cut out and then the leads 2 are subjected to forming to manufacture a semiconductor device.

The semiconductor device thus manufactured can effectively radiate the heat generated in the semiconductor element, and thus it is suitably usable for an IC for a motor driver, an IC for acoustic amplification, etc The ultrasonic bonding method of the radiation plate 3 will be described in detail with reference to FIGS. 3 to 7.

In order to bond the radiation plate 3 to the die pad 1 with ultrasonic waves, a press member 6 and a holding member 4 which serve as the upper and lower clamps for holding the die pad 1 and the radiation plate 3 in an overlay arrangement disposed so as to oppose in the vertical direction, and the ultrasonic horn 5 is linked to the press member 6.

The die pad 1 formed at the center portion of the lead frame A is turned face down, and mounted on the holding member 4, and also the radiation plate 3 is positioned and mounted on the upper side surface (back surface) of the die pad 1. Subsequently, the press member 6 is downwardly moved together with the ultrasonic horn 5 to press the radiation plate 3.

The lower surface of the press member 6, which serves as the press face is provided with a knurled face, 60 which has many intersecting grooves, so that the knurled face 60 is firmly engaged in the surface of the radiation plate 3 to prevent slippage of the radiation plate 3. In FIG. 2, reference numeral 30 represents a clamp track caused by the press member 6.

Figure 5:
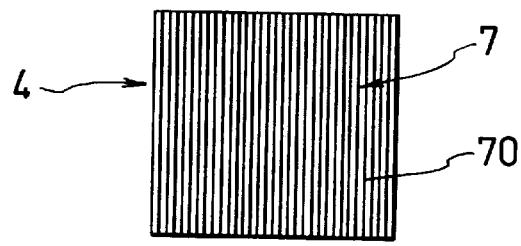
FIG. 5 is a plan view showing a holding knurled face according to an embodiment of the present invention.

Further, the holding face of the holding member 4 is provided with a holding knurled face 7. The present invention is characterized by the pattern of the holding knurled face. As shown in FIG. 5, each groove 70 of the holding knurled face 7 is formed in a direction perpendicular to a vibration direction f of the ultrasonic waves. In this embodiment, the holding knurled face 7 is formed on the overall holding surface of the holding member 4 as shown in FIG. 5.

The die pad 1 is held by the holding member 4 having the holding knurled face 7, and the radiation plate 3 is pressed by the press member 6, and the ultrasonic waves are applied through the press member 6 to to the interface between the die pad 1 and the radiation plate 3, whereby the die pad 1 and the radiation plate 3 are bonded to each other.

The surface roughness based on the respective grooves 70 of the holding knurled face 7, that is, the depth of each groove 70 is preferable set in the range from 20 to 30 $\mu$m, and in this embodiment it is set to 25 $\mu$m.

The setting of the depth of the grooves as described above causes only shallow scratches 11 to be formed on the surface of the die pad 1 (see FIG. 1), and the surface roughness of the die pad 1, that is, the depth of the scratches can be reduced to 15 $\mu$m or less at maximum or 2.0 $\mu$m or less on the average.

Accordingly, it can be prevented that the plating layer formed on the die pad 1 is peeled off due to scratches, and thus the yield of the products can be enhanced. The groove pattern of the holding knurled face 7 is not limited to that of the embodiment shown in FIG. 5, and the patterns shown in FIGS. 6 to 9 may be used.

Figure 6:
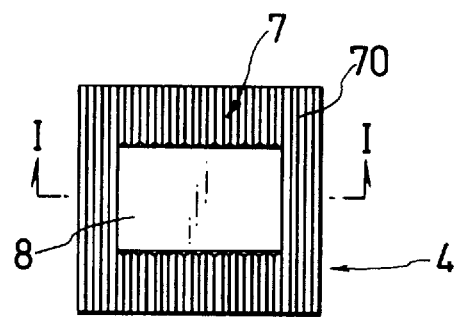
FIG. 6 is a plan view showing an embodiment of the holding knurled face.
Figure 7:
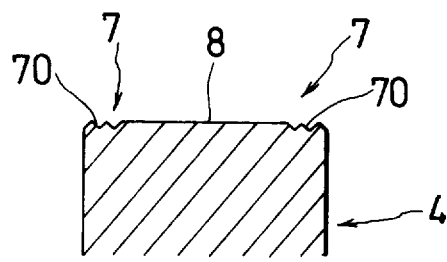
FIG. 7 is a cross-sectional view which is taken along a line I—I of FIG. 6.

That is, as shown in FIGS. 6 and 7, the center portion of the holding face, that is, the portion to which the semiconductor element is fixed, is formed as a flat surface 8, and a holding knurled face 7 is knurled only at the peripheral edge portion thereof.

Figure 8:
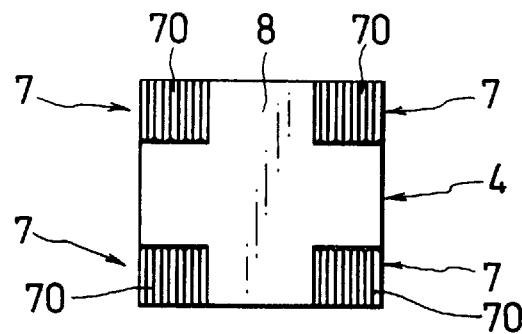
FIG. 8 is a plan view showing an embodiment of the holding knurled face.

Further, as shown in FIG. 8, the holding knurled face 7 is formed at the four corners of the holding surface, and the other portions are designed as a flat surface 8.

Figure 9:
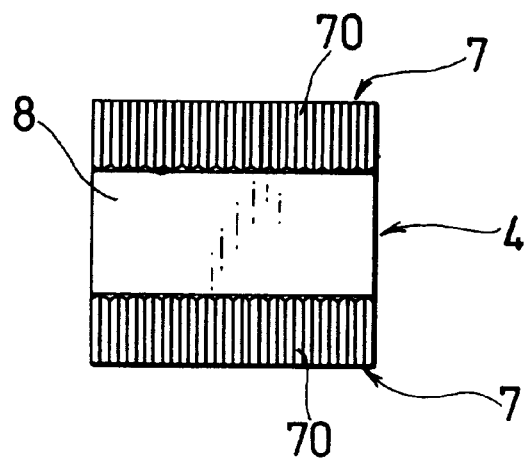
FIG. 9 is a plan view showing an embodiment of the holding knurled face.

Still further, as shown in FIG. 9, a flat surface 8 is formed so as to traverse the center of the holding surface in a fixed width, and the holding knurled faces 7 are formed at opposing side portions of the holding surface so as to sandwich the flat surface 8 therebetween.

In FIGS. 6 to 9, the range of the holding knurled face 7 and the outline shape thereof may be determined suitably.

Figure 11:
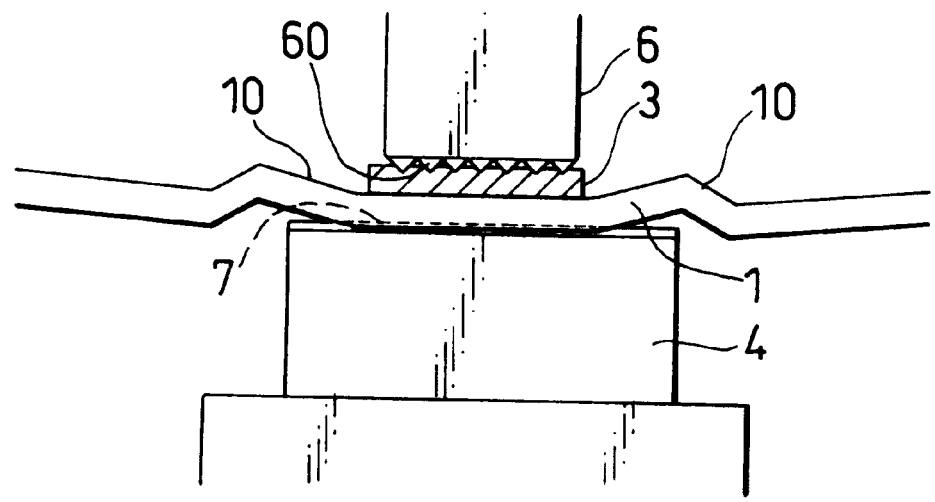
FIG. 11 is a diagram showing a state of a die pad at the press time of a press member.

There may occur a case where in the ultrasonically bonding process, the peripheral edge portions 10 of the die pad 1 float when the radiation plate 3 is pressed by the press member 6 and the holding force of the die pad 1 by the holding member 4 is weakened as shown in FIG. 11. Therefore, a press plate 9 shown in FIG. 12 is used to fixedly press the peripheral edge portions 10 of the back surface of the die pad 1.

Figure 10:
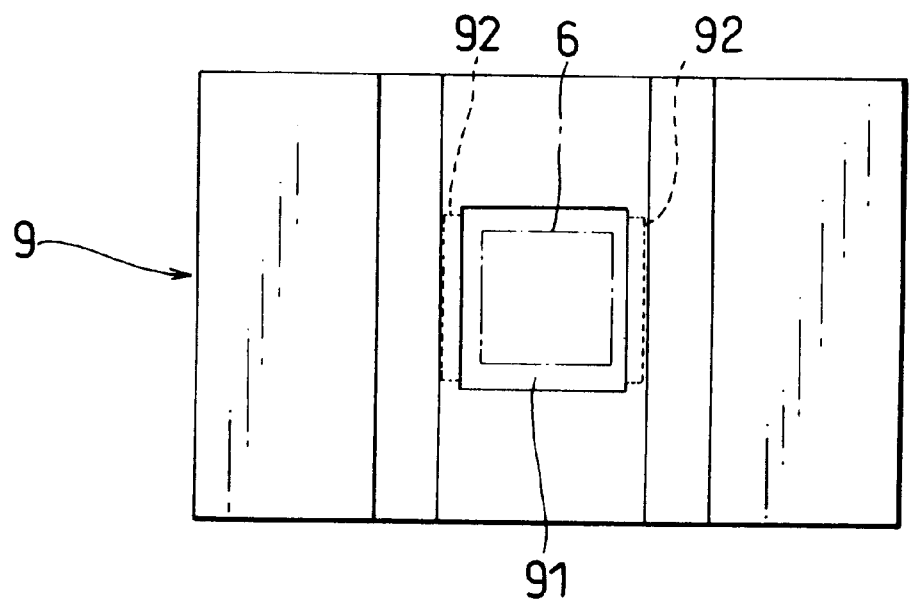
FIG. 10 is a plan view showing a press plate according to the embodiment of the present invention.

FIG. 10 is a diagram showing the press plate 9 used in this embodiment. A hole 91 through which the press member 6 is downwardly moved is formed at the center of the press plate 9, and leg members 92 for fixedly pressing the inner sides of the peripheral portions 10 of the die pad 1 are erected at the two sides of the lower edge portion of the hole 91.

Figure 4:
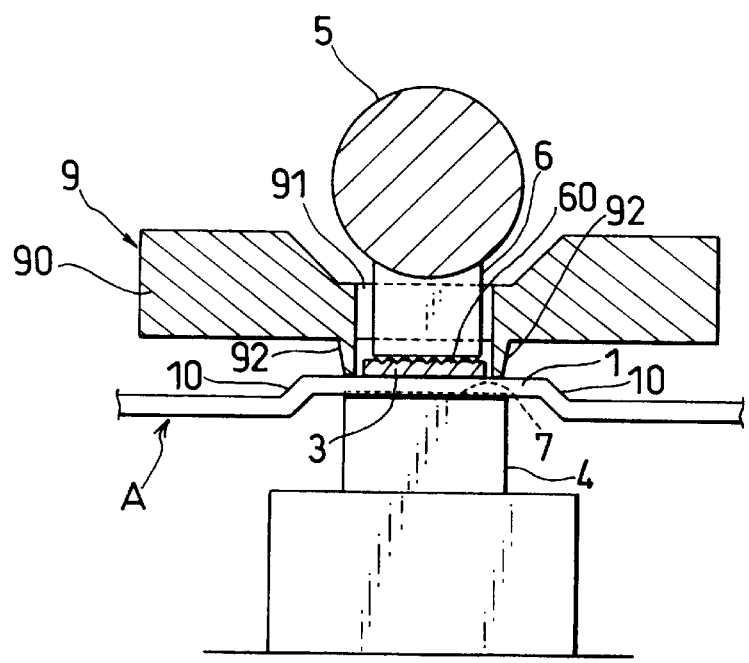
FIG. 4 is a second diagram showing the ultrasonic bonding method.

When the ultrasonic bonding is performed, the back-side peripheral portions 10 of the die pad 1 are pressed and fixed by the leg members 92 of the press plate 9 as shown in FIGS. 4 and 5, and the press member 6 is downwardly moved from the hole 91 to press and fix the radiation plate 3.

Figure 12:
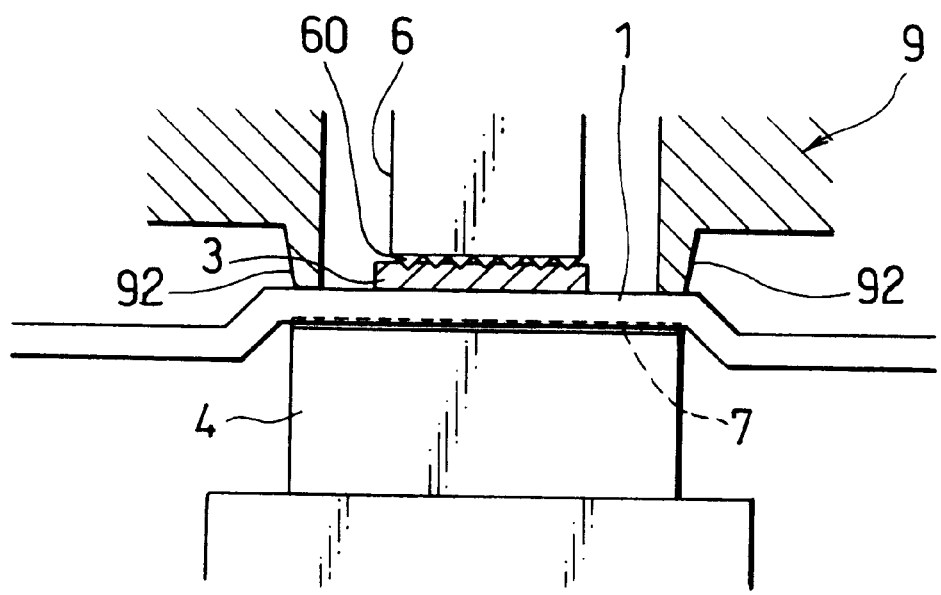
FIG. 12 is a diagram showing a state of the die pad at the press time of the press member when a press plate is used.
Figure 13:
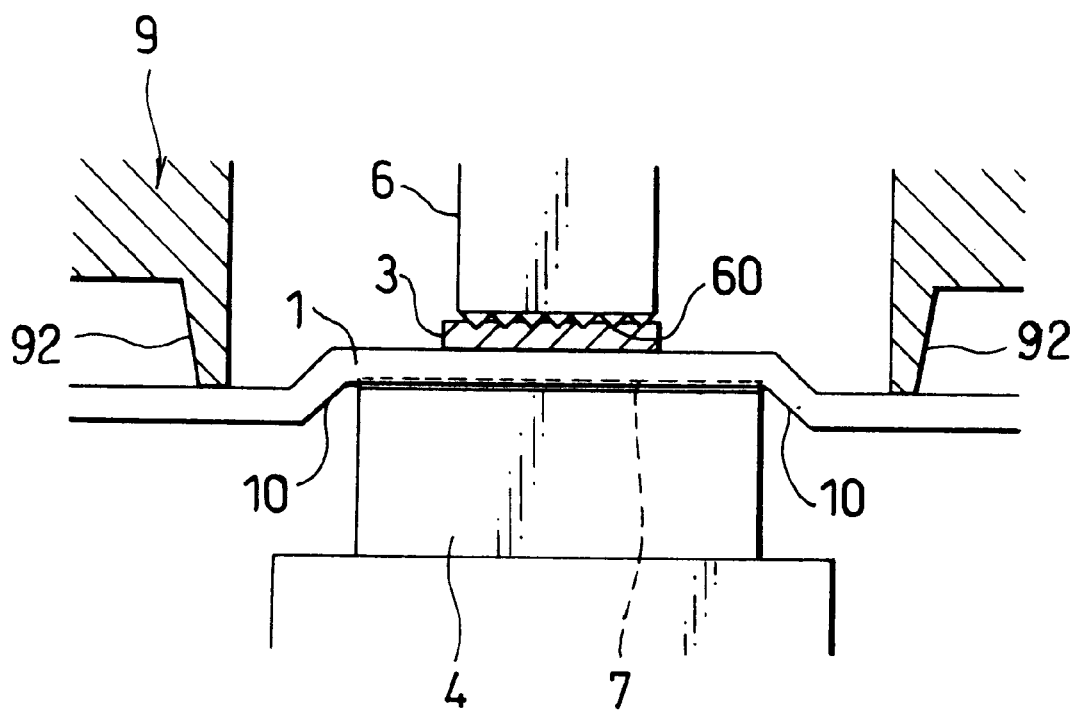
FIG. 13 is a diagram showing an embodiment of the press plate.
Figure 14:
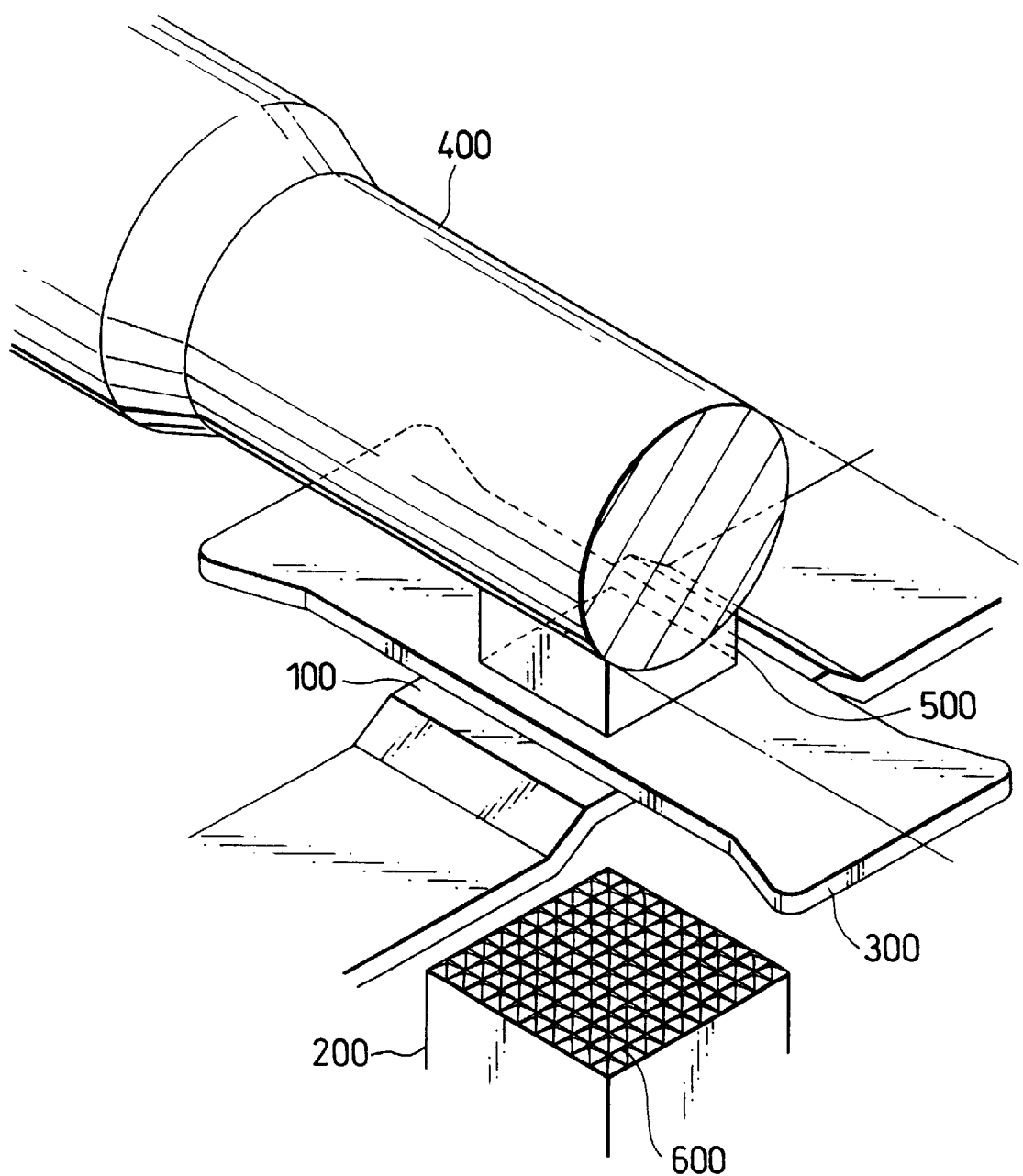
FIG. 14 is a perspective view of a conventional bonding method.

By using the press plate 9 as described above, the floating portion is pressed show in FIG. 12, and the die pad 1 and the holding surface of the holding member 4 are brought into sufficient contact with each other to perform the ultrasonic bonding. In the arrangement of the press plate 9, the legs 92 may be located outwardly from the peripheral edge portions 10 of the die pad 1 as shown in FIG. 13.

The foregoing description is of an embodiment of the bonding method of the radiation plate 3, however, the present invention is not limited to the above embodiment. At any rate, the holding knurled face 7 which are provided with many grooves 70 extending in the direction perpendicular to the ultrasonic-wave application direction is provided on the clamp member for pressing the surface side of the die pad 1 to which the semiconductor element is secured, whereby the depth of the scratches 11 formed on the die pad 1 is set to 15 $\mu$m or less at maximum, and/or 2.0 $\mu$m or less on the average.

Accordingly, in place of the above embodiment in which the die pad 1 is mounted on the holding member 4 and the radiation plate 3 is overlaid on the die pad 1 there may be used another embodiment in which the radiation plate 3 is first mounted on the holding member 4, the die pad 1 is positioned and mounted on the radiation plate 3, the press member 6, linked to the ultrasonic horn 5 is downwardly moved to press the die pad 1, and then ultrasonic wave is applied from the die pad 1 side to bond the die pad and the radiation plate.

In this case, the press face of the press member 6 for pressing the surface of the die pad is not provided with the knurled face 60 having many intersecting grooves, but provided with the holding knurled face 7 having the grooves 70 extending in the direction perpendicular to the ultrasonic-wave applying direction, and the knurled face 60 is provided to the holding surface of the holding member 4 for holding the radiation plate 3.

Further, when the die pad 1 and the radiation plate 3 are clamped during the application of the ultrasonic waves, the holding member 4 is kept stationary and the ultrasonic horn 5 is downwardly moved together with the press member 6 in the above embodiment. As another embodiment, the ultrasonic horn 5 and the press member 6 are kept stationary, and the holding member 4 is upwardly moved, or the ultrasonic horn 5 (and the press member 6) and the holding member 4 are moved so as to approach each other to clamp the die pad 1 and the radiation plate 3.

In each embodiment, the ultrasonic horn 5 and the press member 6 are disposed at the upper side of the holding member 4, however, the positional relationship between these elements may be inverted. That is, it may be adopted that the ultrasonic horn 5 is disposed at the lower side, the radiation plate 3 is mounted on the press holding member 6 linked to the ultrasonic horn 5, the die pad 1 is positioned and mounted on the radiation plate 3, the die pad 1 is pressed by the holding member 4 disposed at the upper side and then ultrasonic waves are applied from the radiation plate 3 side, or the die pad 1 is mounted on the press member 6, the radiation plate 3 is positioned and mounted on the die pad 1, the die pad 1 is pressed by the press member 6 and then ultrasonic waves are applied from the die pad 1 side.

In this case, it is needless to say that the ultrasonic horn 5 and the press member 6 are upwardly moved, or the holding member 4 is downwardly moved, or both the units are moved so as to approach each other.

According to the present invention, the following effect can be achieved.

(1) According to the first aspect of the present invention, in the semiconductor device in which the radiation plate is bonded to the die pad by ultrasonic waves, the depth of scratches which are formed on the surface of the die pad by the clamp member for clamping the die pad and the radiation plate can be reduced to 15 $\mu$m or less at maximum and/or 2.0 $\mu$m on the average, thereby obtaining the semiconductor device having high heat radiation performance. In addition, the scratches on the surface are not formed so deeply that the plating layer on the surface of the die pad is peeled off. Further, there is no disadvantage that the expansion of the solder is disturbed and the semiconductor element cannot be firmly bonded to the die pad, so that the occurrence rate of defective products can be reduced and thus the yield can be enhanced.

(2) According to the second aspect of the present invention, the radiation plate is overlaid on the die pad formed at the center portion of the lead frame, and the radiation plate and the die pad are clamped by the upper and lower clamps having the knurled faces on the clamping surfaces thereof, the knurled face of the clamp member for holding the surface of the die pad being grooved only in the direction perpendicular to the ultrasonic waves application direction. Subsequently, the ultrasonic waves are applied through the clamp member to bond the die pad and the radiation plate with ultrasonic waves, whereby the slippage of the die pad is prevented and the radiation plate can be firmly bonded. In addition, deep scratches which cause peel-off of the plating layer are not formed on the surface of the die pad, and thus the disadvantage that the expansion of the solder is disturbed and the semiconductor element is not firmly bonded to the die pad can be prevented. Therefore, the occurrence rate of defective products can be reduced to enhance the yield.

(3) In the above bonding method, the depth of the grooves of the knurled face is set to 20 to 30 $\mu$m, thereby obtaining the semiconductor device having the effect (1). In addition, the radiation plate is firmly bonded with ultrasonic waves while any scratch which causes the peel-off of the plating layer is prevented from being formed on the surface of the die pad in the manufacturing process.

(4) In the above bonding method, the ultrasonic waves are applied from the clamp member side for holding the surface of the die pad to have the same effects as (1)(2).

(5) In the above bonding method, the ultrasonic waves are applied from the clamp member side for holding the surface of the radiation plate to have the same effects as (1) and (2).

What is claimed is:

1. A method of bonding a radiation plate to a back side of a plated die pad of a lead frame to which semiconductor chips are solder bonded, comprising the steps of:

overlaying the radiation plate on the back side of the plated die pad;

clamping the plated die pad and the radiation plate between first and second clamp members each of which has a knurled face formed on the clamp face thereof, the first clamp member engaging a surface of the plated die pad and having a knurled face with grooves only in a direction perpendicular to an ultrasonic waves applying direction; and applying ultrasonic waves in a direction perpendicular to said grooves through at least one of the first and second clamp members to bond the back side of the plated die pad with the radiation plate while limiting scratch depth on the plate die pad to at least one of a maximum of 15 $\mu$m and an average depth of 2.0 $\mu$m.

2. The radiation plate bonding method as claimed in claim 1, wherein a depth of each of the grooves of the knurled face of the first clamp member is in a range of 20 to 30 $\mu$m.

3. The radiation plate bonding method as claimed in claim 1 or 2, wherein the ultrasonic waves are applied using the second clamp member contacting a surface of the radiation plate.

4. The radiation plate bonding method a claimed in claim 1 or 2, wherein the ultrasonic waves are applied using the first clamp member contacting the surface of the plated die pad.

5. The radiation plate bonding method as claimed in claim 1, wherein the knurled face of the first clamp member has said grooves limited to a perimeter portion surrounding a flat portion which engages an area of the plated die pad to which the semiconductor chip is to be solder bonded.

6. The radiation plate bonding method as claimed in claim 5, wherein a depth of each of the grooves of the knurled face of the first clamp member is in a range of 20 to 30 $\mu$m.

7. The radiation plate bonding method as claimed in claim 1, wherein the knurled face of the first clamp member has said grooves limited to four corner portions and a flat cross portion which engages in at least part an area of the plated die pad to which the semiconductor chip is to be solder bonded.

8. The radiation plate bonding method as claimed in claim 7, wherein a depth of each of the grooves of the knurled face of the first clamp member is in a range of 20 to 30 μm.

9. The radiation plate bonding method as claimed in claim 1, wherein the scratch depth on the plate die pad is a maximum of 15 μm and an average depth of 2.0 μm.

10. The radiation plate bonding method as claimed in claim 2, wherein the scratch depth on the plate die pad is a maximum of 15 μm and an average depth of 2.0 μm.

11. The radiation plate bonding method as claimed in claim 3, wherein the scratch depth on the plate die pad is a maximum of 15 μm and an average depth of 2.0 μm.

12. The radiation plate bonding method as claimed in claim 4, wherein the scratch depth on the plate die pad is a maximum of 15 μm and an average depth of 2.0 μm.

13. The radiation plate bonding method as claimed in claim 5, wherein the scratch depth on the plate die pad is a maximum of 15 μm and an average depth of 2.0 μm.

14. The radiation plate bonding method as claimed in claim 6, wherein the scratch depth on the plate die pad is a maximum of 15 μm and an average depth of 2.0 μm.

15. The radiation plate bonding method as claimed in claim 7, wherein the scratch depth on the plate die pad is a maximum of 15 μm and an average depth of 2.0 μm.

16. The radiation plate bonding method as claimed in claim 8, wherein the scratch depth on the plate die pad is a maximum of 15 μm and an average depth of 2.0 μm.

* * * * *